United States Patent [19]

Zamapian

[11] Patent Number: 5,422,506
[45] Date of Patent: Jun. 6, 1995

[54] FIELD EFFECT TRANSISTOR STRUCTURE HEAVILY DOPED SOURCE/DRAIN REGIONS AND LIGHTLY DOPED SOURCE/DRAIN REGIONS

[75] Inventor: Mehdi Zamapian, Carrollton, Tex.

[73] Assignee: SGS-THOMSON Microelectronics, Inc., Carrollton, Tex.

[21] Appl. No.: 316,814

[22] Filed: Oct. 3, 1994

Related U.S. Application Data

[60] Continuation of Ser. No. 950,185, Sep. 24, 1992, abandoned, which is a division of Ser. No. 678,018, Apr. 1, 1991, Pat. No. 5,171,700.

[51] Int. Cl.$^6$ .................... H01L 29/10; H01L 29/78; H01L 29/06
[52] U.S. Cl. .................... 257/344; 257/408; 257/900
[58] Field of Search ............... 257/336, 344, 408, 900

[56] References Cited

U.S. PATENT DOCUMENTS

| | | | |
|---|---|---|---|
| 4,656,492 | 4/1987 | Sumani et al. | 257/336 |
| 4,818,715 | 4/1989 | Chao | 257/344 |
| 4,935,379 | 6/1990 | Toyoshima | 257/344 |
| 4,949,136 | 8/1990 | Jain | 257/344 |
| 4,981,810 | 1/1991 | Fazan et al. | 257/900 |
| 5,091,763 | 2/1992 | Sanchez | 257/900 |

*Primary Examiner*—Ngân V. Ngô
*Attorney, Agent, or Firm*—Kenneth C. Hill; Lisa K. Jorgenson; Richard K. Robinson

[57] ABSTRACT

A field effect transistor structure includes heavily doped source/drain regions and lightly doped source/drain regions, The lightly doped source/drain regions extend form the source drain regions partway under a sidewall spacer adjacent a gate electrode. Very lightly doped source/drain regions extend the remainder of the way under the sidewall spacers to provide improved transistor characteristics.

7 Claims, 1 Drawing Sheet

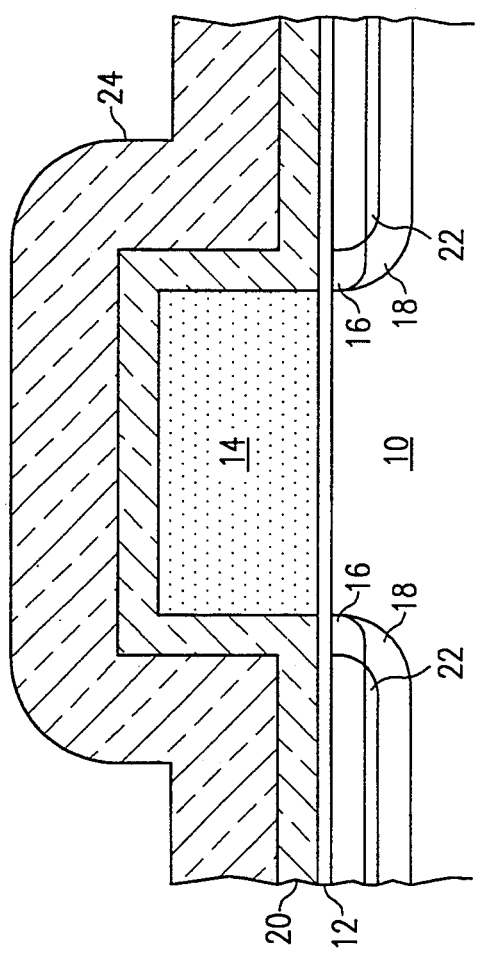
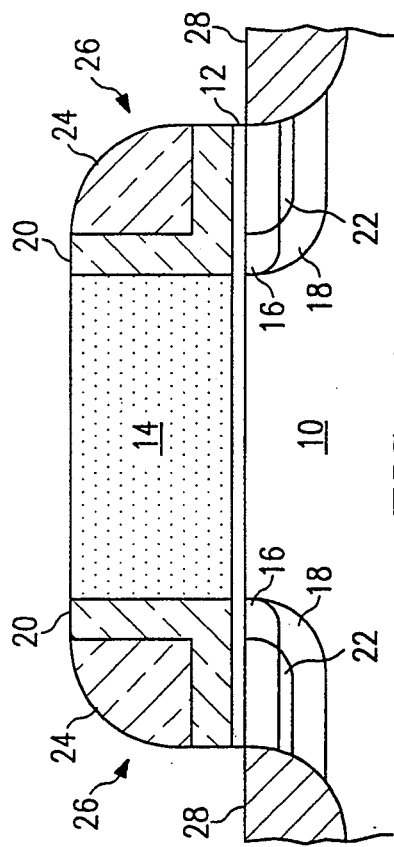
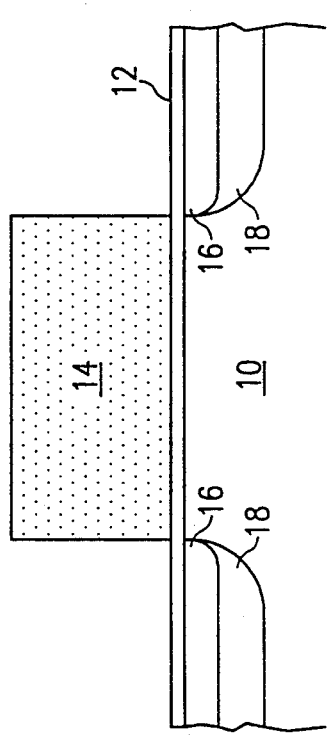
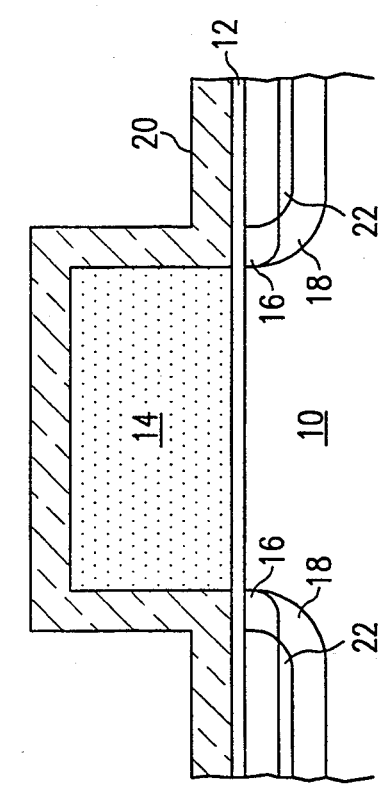

FIELD EFFECT TRANSISTOR STRUCTURE HEAVILY DOPED SOURCE/DRAIN REGIONS AND LIGHTLY DOPED SOURCE/DRAIN REGIONS

This is a continuation of application Ser. No. 07/950,185, filed Sep. 24, 1992, now abandoned, which is a division of application Ser. No. 678,018, filed Apr. 1, 1991, now U.S. Pat. No. 5,171,700.

BACKGROUND OF THE INVENTION

1. Field of the Invention

The present invention relates generally to semiconductor integrated circuits, and more specifically to a method for forming field effect devices in a semiconductor substrate.

2. Description of the Prior Art

To increase the number of devices which can be fabricated on a single integrated circuit chip, lower the cost of integrated circuit devices, and improve performance, transistors continue to be made smaller. For feature sizes less than approximately one micron, especially for sizes of approximately one-half micron and below, a number of performance problems are encountered due to the physics of semiconductors and small transistor sizes.

As known in the art, short channel effects degrade transistor performance. In order to counter these degradations, it is known in the art to form lightly doped drain (LDD) regions between the transistor channel and the more heavily doped source/drain regions. This provides a more lightly doped, graded, impurity region near the edges of the gate, decreasing the impact of problems such as the hot electron effect.

With device feature sizes greater than approximately one micron, later thermal processing cycles cause some diffusion of the implanted lightly doped drain region. This diffusion provides an impurity gradient which helps minimize the effect of high electric fields and enhances device performance.

With smaller geometries, such as one-half micron and below, later thermal cycles are minimized. The thermal budget allowed for very small feature size devices must be decreased because the source/drain junctions must be shallower than is the case with larger devices. A lower thermal budget means that the lightly doped drain regions diffuse to a lesser degree than is the case with larger devices, and this lesser diffusion does not provide the same LDD gradient profile as occurs with larger devices. Thus, with smaller devices, a sharper gradient occurs near the channel, which means that higher electric fields still occur in this region. The shorter channel used with smaller geometry devices also tends to increase the electric field gradient, further exacerbating the problem.

It is known in the art to provide lightly doped drain regions having multiple steps of impurity levels. For example, U.S. Pat. No. 4,356,623, issued Nov. 2, 1982 to W. R. Hunter, describes a technique for fabricating field effect devices which have stepped lightly doped drain regions. These are formed by forming, in succession, multiple sidewall regions on the gate electrodes, followed by impurity implants after each layer of sidewall formation. Formation of multiple sidewalls in this manner, and the attendant damage to the gate and to underlying structures caused by multiple anisotropic etch back steps, can have an adverse impact on device functionality.

It would be desirable to provide a method for fabricating very small transistors which provides graded impurity density in the lightly doped drain regions. It would be further desirable for such method to be simple to perform and to provide a highly functional device.

SUMMARY OF THE INVENTION

It is therefore an object of the present invention to provide a method for forming semiconductor field effect devices, and to provide a structure formed by such method.

It is another object of the present invention to provide such a structure and method which provides lightly doped drain regions suitable for use with very small device feature sizes.

It is a further object of the present invention to provide such a structure and method which adds a minimal amount of complexity to the device fabrication process.

Therefore, according to the present invention, after formation of gate electrodes in a field effect device, first lightly doped drain regions, and opposite contactivity type halo regions, are formed by implant into the substrate. A first thin oxide layer is then formed over the device, followed by an implant of a second lightly doped drain region. The second lightly doped drain region will be spaced further from the channel of the field effect device than the first lightly doped drain region by the thickness of the thin oxide layer. A second oxide layer is then formed over the device, followed by an anisotropic etch back to form sidewall regions alongside the gate electrode of the device. The sidewall regions are used to align the heavy impurity implant for forming source/drain regions.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 1–4 illustrate a preferred method for forming a field effect transistor according to the present invention.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Referring to FIG. 1, a field effect transistor is to be formed in a semiconductor substrate 10. Assuming the formation of an N-channel transistor, substrate 10 will be doped P-type. After formation of field oxide regions (not shown) to define active regions in the substrate 10, a thin gate oxide 12 is grown over the surface of the substrate 10. This is followed by deposition of a polycrystalline silicon layer 14 over the device, which is subsequently patterned to define gate electrodes as shown in FIG. 1. As known in the art, gate electrode 14 may be polycrystalline silicon which is highly doped to improve its conductivity, or it may be a polycrystalline silicon which has been silicided with a refractory metal such as tantalum or tungsten.

After the gate electrode 14 has been patterned, a light (N$^{--}$) implant is made to define first lightly doped drain regions 16. This is followed by formation of P-type halo regions 18, which are implanted to a greater depth than the N$^{--}$ lightly doped drain regions 16.

Halo regions 18 are formed by implanting a P-type impurity (for an N-channel transistor) at a dosage (P$^-$) which is slightly higher than that used for the formation of the first lightly doped drain region 16. Formation of the halo regions 18 helps improve the device's punch-through and $V_T$ roll off characteristics. If desired, the implant of the halo regions 18 can be performed before formation of the N$^{--}$ lightly doped drain regions 16.

Referring to FIG. 2, an oxide layer 20 is formed over the device. This oxide layer 20 is preferably an undoped CVD oxide, which is deposited to a thickness of between approximately 500 and 1200 angstroms. In the alternative, the layer 20 could be grown. Following formation of the oxide layer 20, an N-type impurity is again implanted into the substrate 10 to form second (N$^-$) lightly doped drain regions 22. This implant is made at a higher impurity level than that which is used to form first lightly doped drain region 16.

If desired, an additional P$^-$ halo implant can be made at this point in the process. Such halo implant may be made either before or after the implant which forms the second (N$^-$) lightly doped drain regions 22. The effect of the second halo implant is to provide a step graded halo in the same manner that a step graded lightly doped drain is formed by the regions 16 and 22.

Referring to FIG. 3, a second oxide layer 24 is formed over the device, again preferably using a CVD oxide. Oxide layer 24 is preferably formed to a thickness between approximately 2500 to 3500 angstroms.

Referring to FIG. 4, an anisotropic etch is used to remove portions of oxide layers 12, 20, and 24. This results in the formation of sidewall oxide spacers 26, with each of the spacers 26 being formed from portions of the oxide layers 12, 20, and 24. Following formation of the oxide spacers 26, a heavy N-type implant is made in the device to form source/drain regions 28. This results in the structure shown in FIG. 4. Later process steps, including formation of interlevel oxides, formation of polycrystalline silicon and metal interconnect layers, and device passivation, are performed as known in the art.

It will be appreciated by those skilled in the art that the junctions at the edges of the implanted regions 16, 18, 22, 28, will migrate from the positions shown in FIG. 4 during later thermal cycles. However, they will tend to keep approximately the relative positions shown in FIG. 4.

The doping concentrations used for the various regions described above will be chosen to be compatible with the user's process flow. By way of example, preferred concentrations can be approximately 5-7 E12 atoms/cm$^3$ for the N$^{--}$ regions, 3 E13 atoms/cm$^3$ for the N$^-$ regions, and 1 E13 atoms/cm$^3$ for the halo regions. These concentrations can be varied to suit the requirements of the process which is used, and the device being fabricated.

The method described above produces a lightly doped drain region having a very lightly doped portion adjacent to the channel of the device, with a more moderately doped region between the very lightly doped region and the source/drain region. Thus, implantation steps have been used to approximate a graded lightly doped drain region to replace the diffusion gradient which occurs in the prior art to the lightly doped drain region during later thermal cycles. A P-type halo has been included with the step graded lightly doped drain region in order to prevent punch through and improve $V_T$ roll off characteristics for the device.

The described example has illustrated the formation of an N-channel field effect transistor on a P-type substrate. As known in the art, such a transistor may also be formed within a P-type tub region within an N-type substrate. The described techniques can also be used, if desired, to form enhancement mode P-channel field effect transistors in an N-type substrate or tub. Formation of a P-channel device simply involves changing the impurities introducted at the various steps.

While the invention has been particularly shown and described with reference to a preferred embodiment, it will be understood by those skilled in the art that various changes in form and detail may be made therein without departing from the spirit and scope of the invention.

What is claimed is:

1. A semiconductor field effect device structure, comprising:

a gate oxide layer on a semiconductor substrate;
 a conductive gate electrode on said gate oxide layer;
 a first oxide layer extending along and in contact with said gate oxide from a position adjacent said gate electrode to a first location spaced therefrom, said first oxide layer having a substantially constant first thickness, said first oxide layer further extending alongside first and second vertical sides of said gate electrode and having a substantially constant thickness equal to the first thickness, wherein the first oxide layer has an L-shaped cross section;
 a second oxide sidewall region adjacent said first oxide layer on each of the first and second sides, wherein said second oxide regions are separated from said gate electrode by said first oxide layer, and are separated from the substrate by said gate oxide and first oxide layers, and wherein said second oxide sidewall regions are, in a direction perpendicular to the gate electrode vertical sides, thicker near the gate oxide layer and thinner at a location spaced therefrom;
 wherein said first oxide layer in combination with said second oxide regions define sidewall insulating regions alongside said gate electrode;
 heavily doped source/drain regions beyond approximately an edge of the sidewall insulating regions spaced from said gate electrode;
 lightly doped source/drain regions adjacent to said heavily doped source/drain regions, and extending partway under the sidewall regions to a location approximately under a vertical interface of said first oxide layer and said second oxide regions;
 very lightly doped source/drain regions adjacent said lightly doped source/drain regions and extending to a location approximately under a vertical edge of said gate electrode; and
 halo regions having a conductivity type opposite to that of the source/drain regions, and located between said lightly doped and very lightly doped regions and the substrate, and extending to a location approximately under a vertical edge of said gate electrode.

2. A semiconductor field effect device structure, comprising:

a gate oxide layer on a semiconductor substrate;

a conductive gate electrode on said gate oxide layer;

a first oxide layer extending along and in contact with said gate oxide from a position adjacent said gate electrode to a first location spaced therefrom, said first oxide layer having a substantially constant first thickness, said first oxide layer further extending alongside first and second vertical sides of said gate electrode and having a substantially constant thickness equal to the first thickness, wherein the first oxide layer has an L-shaped cross section;

a second oxide sidewall region adjacent said first oxide layer on each of the first and second sides, wherein said second oxide regions are separated from said gate electrode by said first oxide layer, and are separated from the substrate by said gate oxide and first oxide layers, and wherein said second oxide sidewall regions are, in a direction perpendicular to the gate electrode vertical sides, thicker near the gate oxide layer and thinner at a location spaced therefrom;

wherein said first oxide layer in combination with said second oxide regions define sidewall insulating regions alongside said gate electrode;

heavily doped source/drain regions beyond approximately an edge of the sidewall insulating regions spaced from said gate electrode;

lightly doped source/drain regions adjacent to said heavily doped source/drain regions, and extending partway under the sidewall regions to a location approximately under a vertical interface of said first oxide layer and said second oxide regions, such lightly doped source/drain regions having a doping concentration of approximately $3 \times 10^{13}$ cm$^{-3}$; and very lightly doped source/drain regions adjacent said lightly doped source/drain regions and extending to a location approximately under a vertical edge of said gate electrode, such very lightly doped source/drain regions having a doping concentration in the range of approximately $5 \times 10^{12}$ cm$^{-3}$ to $7 \times 10^{12}$ cm$^{-3}$.

3. The structure of claim 2, further comprising:

halo regions having a conductivity type opposite to that of the source/drain regions, and located between said lightly doped and very lightly doped regions and the substrate, and extending to a location approximately under a vertical edge of said gate electrode.

4. The structure of claim 3, wherein said halo regions have a doping concentration of approximately $10^{13}$ cm$^{-3}$.

5. The structure of claim 3, wherein said heavily doped, lightly doped, and very lightly doped source/drain regions are N conductivity type, and said halo regions are P conductivity type.

6. The structure of claim 2, wherein said heavily doped, lightly doped, and very lightly doped source/drain regions are N conductivity type.

7. The structure of claim 1, wherein said heavily doped, lightly doped, and very lightly doped source/drain regions are N conductivity type, and said halo regions are P conductivity type.

* * * * *

UNITED STATES PATENT AND TRADEMARK OFFICE
CERTIFICATE OF CORRECTION

PATENT NO. : 5,422,506
DATED : June 6, 1995
INVENTOR(S) : Medhi Zamanian

It is certified that error appears in the above-indentified patent and that said Letters Patent is hereby corrected as shown below:

On the title page, Item [75] Inventor change "Zamapian" to --Zamanian--.

Signed and Sealed this

Twelfth Day of December, 1995

Attest:

BRUCE LEHMAN

Attesting Officer     Commissioner of Patents and Trademarks